United States Patent [19]
Burkey

[11] Patent Number: 5,122,850
[45] Date of Patent: Jun. 16, 1992

[54] BLOOMING CONTROL AND REDUCED IMAGE LAG IN INTERLINE TRANSFER CCD AREA IMAGE SENSORS

[75] Inventor: Bruce C. Burkey, Rochester, N.Y.

[73] Assignee: Eastman Kodak Company, Rochester, N.Y.

[21] Appl. No.: 644,163

[22] Filed: Jan. 22, 1991

Related U.S. Application Data

[63] Continuation-in-part of Ser. No. 402,414, Sep. 5, 1989.

[51] Int. Cl.⁵ .................. H01L 29/78; H01L 27/14; H01L 31/00
[52] U.S. Cl. ........................... 357/24; 357/30; 358/213.19
[58] Field of Search .......... 357/24 LR, 24 M, 24, 357/30 F, 30 H; 358/213.19

[56] References Cited

U.S. PATENT DOCUMENTS

| | | | |
|---|---|---|---|
| 4,780,765 | 10/1988 | Hamasaki et al. | 357/24 LR |
| 4,814,848 | 3/1989 | Akimoto et al. | 357/24 LR |
| 4,851,890 | 7/1989 | Miyatake | 357/24 LR |

Primary Examiner—Andrew J. James
Assistant Examiner—Ngan Van Ngo
Attorney, Agent, or Firm—Raymond L. Owens

[57] ABSTRACT

An interline area image sensor structure with particular doping arrangements which provides an effective antiblooming control and, when a voltage signal is applied to each transfer gate, all the charge collected in a photodiode will be depleted and transferred to an interline CCD.

1 Claim, 5 Drawing Sheets

BLOOMING CONTROL AND REDUCED IMAGE LAG IN INTERLINE TRANSFER CCD AREA IMAGE SENSORS

CROSS REFERENCE TO RELATED APPLICATIONS

This is a continuation in part of my earlier filed application Ser. No. 402,414, filed Sep. 5, 1989.

FIELD OF THE INVENTION

This invention relates to interline image sensors and, more particularly, an architecture that allows complete charge transfer from photodiodes while simultaneously preserving the vertical antiblooming function.

BACKGROUND ART

FIG. 1 schematically shows the general organization of an interline area image sensor having an array of photodiode sensor elements. Several of the sensor elements 16 which are shown in FIG. 1 are identified as A, B, C, D, E, F, G, H and I. The elements are arranged in columns and rows. Photo charge is integrated in each photodiode and, at a predetermined time, appropriate bias voltage pulse signals are applied to the transfer gate electrodes causing the charge to transfer from the photodiode to a vertical CCD shift register 26. Those skilled in the art will appreciate that the shift registers 26 conveniently can be constructed in two phase buried channel architecture.

Each CCD shift register 26 will be under the control of a plurality of electrodes 26a and 26b (see FIG. 3). When a potential is applied to an electrode, a depletion region is formed under that electrode. Consider, for example, a buried channel CCD shift register which is formed with a p-substrate covered with a silicon dioxide layer with an n-buried channel on which there has been deposited a row of closely spaced electrodes for operating a shift register 26. FIG. 3 illustrates a single pixel of a conventional interline transfer CCD image sensor. The electrodes 6a and 26b may be one half stage of either a four phase or a pseudo two phase shift register as would be appropriate for an interlaced image sensor. In the pseudo two phase implementation electrodes 26a and 26b are driven from the same bias source with electrodes 26a and 26b being the transfer and storage regions, respectively. If the two electrodes 26a and 26b each contain both a transfer and storage region, then they provide one complete CCD stage of what we will call a true two phase CCD. Such a two phase CCD is effective in a non-interlaced interline CCD image sensor.

After the signal charge is transferred from the photodiode, 16, to the vertical shift register, 26, the signal charge may be shifted vertically down the shift registers, 26, a line at a time, into a horizontal shift register, 27 (see FIG. 1). The pixel charge information is shifted to a buffer amplifier where it is converted to an output voltage proportional to the pixel charge, and becomes available for off-chip signal processing, storage and/or display.

Both image lag and blooming severely degrade the performance of interline transfer type image sensors. Both of these phenomena must be controlled at the sensor design stage. Image lag is the persistence of an image into subsequent fields and is a direct consequence of a photodiode that cannot be reset to a fully depleted condition upon readout of the signal from the photodiode to the vertical CCD shift register. The effect of this is to leave a residual signal behind that becomes signal in subsequent fields. The inability to fully reset the photodiode is caused by the doping distributions required to achieve another desirable feature in the sensor, namely antiblooming via a vertical antiblooming drain. Blooming results when an area of the image sensor receives an amount of illumination that generates signal charges in excess of the charge capacity of either the photodiode or a stage of the vertical shift register. The excess charge spreads or "blooms" along the vertical shift register, thus contaminating the signal from other pixels. Blooming control is essential in applications wherein the light level is not controlled. A vertical overflow drain (VOD) is a commonly used technique for controlling antiblooming. There is a need in the art for an interline transfer CCD fabrication design that permits a fully depletable photodiode for complete elimination of image lag while simultaneously retaining the vertical overflow drain for antiblooming protection.

As shown in FIG. 2a, an example of a prior art interline CCD image sensor 10 with vertical overflow antiblooming protection is shown in cross-section. A p-well 12 is ion implanted into an n-type substrate 14. An n-layer 16a is added in the well 12. A p-layer, 16b, on the n-layer 16a completes the photodiode 16. The p-layer, 16b, is added to attempt to fabricate a fully depletable photodiode. A gate oxide 18 is formed on the substrate surface. Appropriate channel stops 17 and 17a include a thick oxide with a p-type diffusion beneath are also provided. An n-buried channel 20 is formed in the p-well 12 and spaced from the photodiode 16 (FIG. 1). A polysilicon or other metallic gate 22 is positioned on the gate oxide 18 and is both one of the CCD phase gates as well as the transfer gate from the photodiode to the buried channel CCD. First, the p-well ion implant doping is placed everywhere except that it is omitted from under the photodiode. Thereafter a high temperature and/or long time furnace diffusion step occurs that drives the p-well both vertically and horizontally until it is driven completely beneath the center of the photodiode. The overflow current to the substrate occurs at the point shown in FIG. 2a where the p-well doping is a minimum. This process does not permit a fully depletable diode because of the potential barrier shown by the arrows in FIG. 2b. In FIG. 2b, the electrostatic potential for both readout of the CCD and reset of the photodiode is shown. In the first situation (readout of the vertical CCD), no or only small positive potential is applied to the transfer gate 22. In the second situation, a more positive potential is applied to the gate 22 and charge flows from the photodiode to the buried channel. However, a large electrostatic potential barrier still occurs between the center of the photodiode and the edge of the transfer gate. This is a direct result of the p-well 12 doping gradient that arises from the diffusion of the p-well under the photodiode. The potential barrier prevents the complete depletion of the photodiode 16 through the transfer gate, and thus also inhibits the elimination of image lag.

The object of this invention is to provide an interline CCD which includes effective vertical overflow drain blooming control and eliminates image lag.

SUMMARY OF THE INVENTION

In an interline area image sensor which eliminates image lag while providing antiblooming protection and has a substrate having top and bottom surfaces in which is fabricated an array of photodiodes, a plurality of vertical CCDs for transferring charge in said image sensor including a plurality of transfer gate electrodes, each transfer gate electrode being formed over the substrate top surface and corresponding to a particular photodiode and extending over a substrate transfer region positioned adjacent to a corresponding photodiode and responsive to a voltage signal for transferring charge from its corresponding photodiode to its particular CCD, the improvement comprising;

a) the substrate having an n-conductive portion, a uniformly lightly doped p-well formed in the n-conductive portion and spaced from the top surface of the substrate, a uniformly lightly doped n-well formed on top of the uniform p-well, localized p- and n-layers formed in the n-well to complete a photodiode for collecting photocharge, and such p-layer and p-well being connected to a predetermined potential, this arrangement being selected to provide a vertical antiblooming overflow drain with the overflow point being confined to be in the uniform p-well to maintain high quantum efficiency; and b) a plurality of p-stripes connected to a predetermined potential and formed in the uniform lightly doped n-well, each p-stripe being associated with a particular photodiode and having a portion formed under each CCD shift register and a thermally diffused portion providing sufficient doping beneath a transfer gate electrode but not extending to its photodiode such that when the voltage signal is applied to the transfer gate electrode, signal charge collected in the photodiode is transferred to the n-buried channel leaving the photodiode completely depleted.

Advantages of this invention include: (1) a fully depletable photodiode which provides a lag free image sensor because the photodiode is fabricated in uniform n- and p-wells so it does not have doping gradients from center to transfer gate edge that create a potential barrier that would preclude a fully depleted condition. (2) The extension of the light n-well laterally beneath both the channel stop and the vertical shift register will reduce the image smear caused by diffusion of optically generated signal from the regions adjacent to the photodiode into the shift register. This is caused by the electric fields resulting from the doping profile and the biasing of the photodiode, shift register, p-well and substrate. (3) CCDs made in accordance with this invention are particularly amenable to scaling to smaller dimensions. Since the vertical overflow drain is formed from the juxtaposition of the uniform p- and n-wells, the dimension of a pixel is not a factor in the doping at the overflow point. The softness of the overflow turn-on is influenced by the separation of the overflow point from the p-stripes and p-field channel stops, but in such a way that the turn-on is sharper, that is, the subthreshold current non-ideality factor becomes smaller as the pixel becomes smaller. (4) Because the overflow point is constrained to the uniform p-well, which is always below the uniform n-well, the volume for optical absorption and generation of signal results in an increase in quantum efficiency in the green and red portion of the light spectrum. Furthermore, a process simplification occurs because the uniform p-and n-wells need only be formed by gross masking.

BRIEF DESCRIPTION OF THE DRAWINGS

FIG. 2b shows electrostatic potential curves for operating the device of FIG. 2a;

DESCRIPTION OF THE PREFERRED EMBODIMENT

Figure 3:
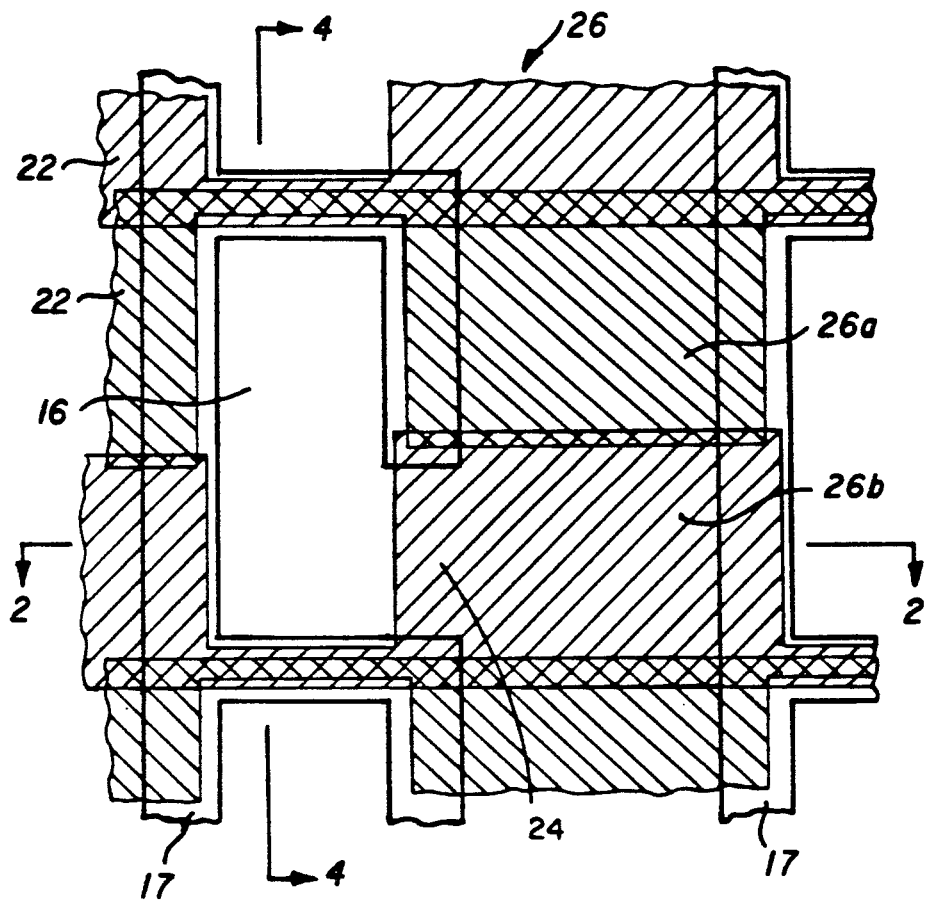
FIG. 3 is a plan view of a pixel in accordance with the present invention.

A plan view of a single pixel for an interline CCD (see FIG. 1) in accordance with this invention is shown in FIG. 3. A pixel is comprised of a photosensitive area which we have previously called the photodiode 16, one or one half stage of the vertical shift register (for non-interlaced or interlaced architecture, respectively), each predetermined polysilicon gate electrode 26b corresponds to a particular photodiode and forms both the transfer gate under which, in a transfer region, signal charge is transferred from the photodiode to the CCD 26 and channel stop isolation regions 17 separating the photodiode and CCD 26 and also vertically adjacent photodiodes. The CCD includes polysilicon phase gate electrodes 26a. This plan view is common to any interline transfer CCD image sensor, independent of whether it is interlaced or non-interlaced and the physical dimensions of the pixel. As shown in FIG. 3, the transfer gate 24, which is the opening in isolation regions 17 between the photodiode 16 and CCD 26, is conventionally controlled by one of the vertical CCD electrodes 26b, but can be a separate electrode.

Figure 4:
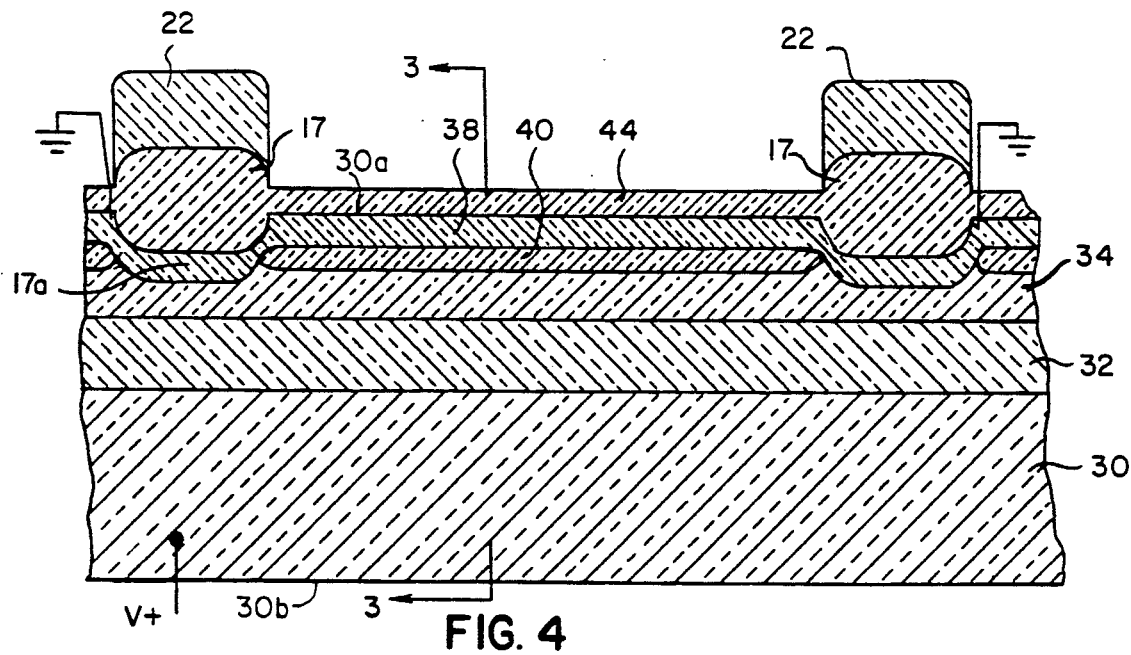
FIG. 4 is a sectional taken along the lines 4—4 of FIG. 3, with certain conductors not shown.

Turning now to FIG. 4, an n-type substrate 30 has a uniform lightly doped p-well 32 implanted and then thermally diffused into it. The substrate 30 defines top and bottom surfaces 30a and 30b, respectively. A uniform n-well 34 is then implanted into the top portion of the p-well 32. The substrate is heated again to thermally drive both wells 34 and 32 into the substrate. As a result of the careful choice of implant parameters and thermal processing, the narrow, uniformly lightly doped p-well 32 is provided typically several micrometers below the substrate top surface 30a. Thereafter, p- and n-layers 38 and 40, respectively, are formed in the n-well 34 for a depletable photodiode. As will be discussed later with refer to FIG. 2c, the above arrangement provides a vertical overflow drain structure. A thermal oxide 44 is formed on the surface of the p-layer 38. The photodiode 16 is not labeled in FIGS. 4 and 5. The combination of uniform n-layer 34 and localized n-layer 40 forms the n-portion of the photodiode. A photodiode is a p-n junction, and for this embodiment, the photodiode has two p-n junctions, one formed by uniform n-layer 34 with uniform p-layer 32, and the second formed by localized n-layer 40 and localized p-layer 38. In response to actinic light, charge is collected in the parallel combination of these junctions.

Figure 5:
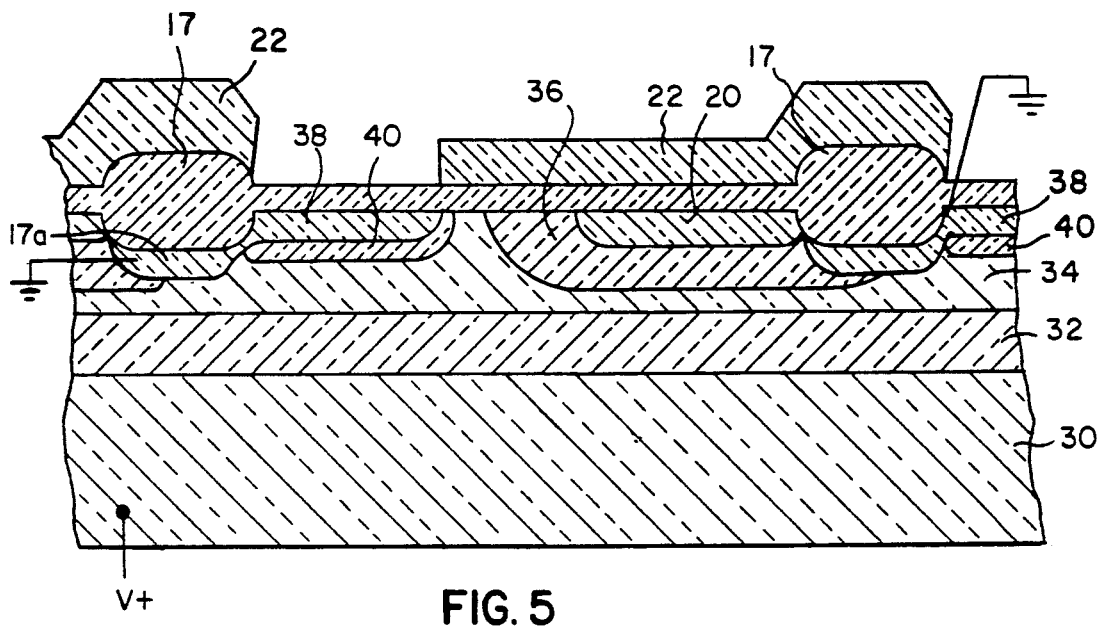
FIG. 5 is a sectional taken along the lines 2—2 of FIG. 3 but showing a structure in accordance with the invention.

The photodiode isolation in the vertical direction as shown in FIG. 4 and in the horizontal direction, except for the transfer gate as indicated in the plan view of FIG. 3, is accomplished by appropriate channel stops 17 comprised of a thick oxide 17 with p-type diffusion 17a beneath, as is shown in FIG. 4 and FIG. 5. Other isolation technology could also be used. Such isolation is part of the standard interline transfer CCD process. The p-layers 38 and 17a are physically contiguous and are electrically connected to a voltage bias supply shown at ground potential.

Figure 2A:
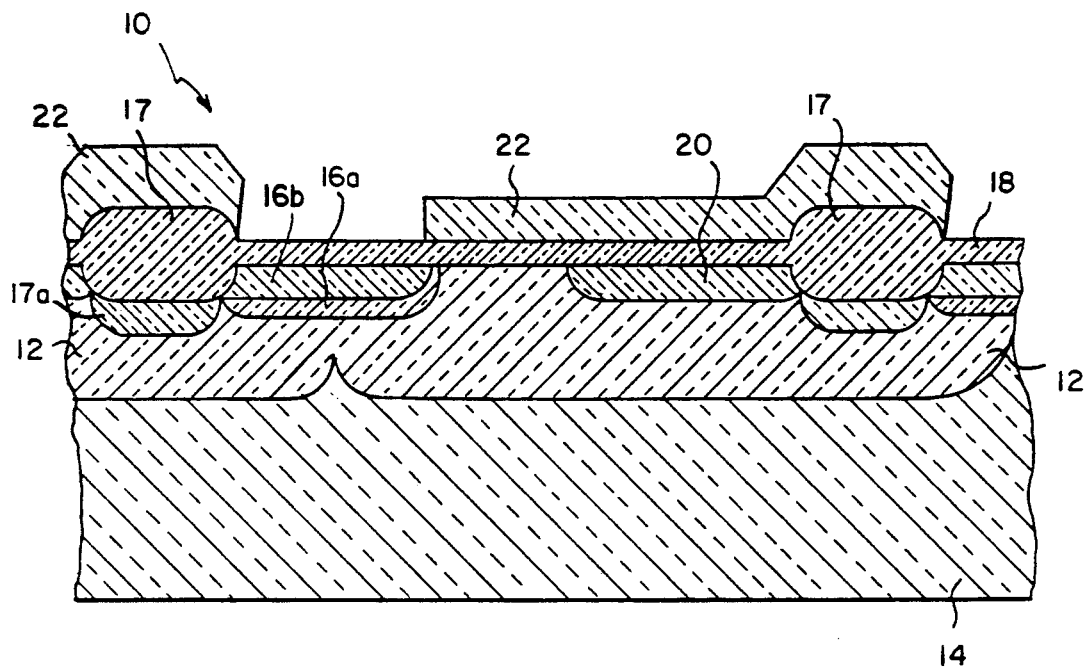
FIG. 2a is a cross-section of a pixel of a prior art CCD with a vertical overflow drain formed by the diffusion of a single p-well under the photodiode taken along the lines 2—2 of FIG. 3, with certain conductors not shown.
Figure 2B:
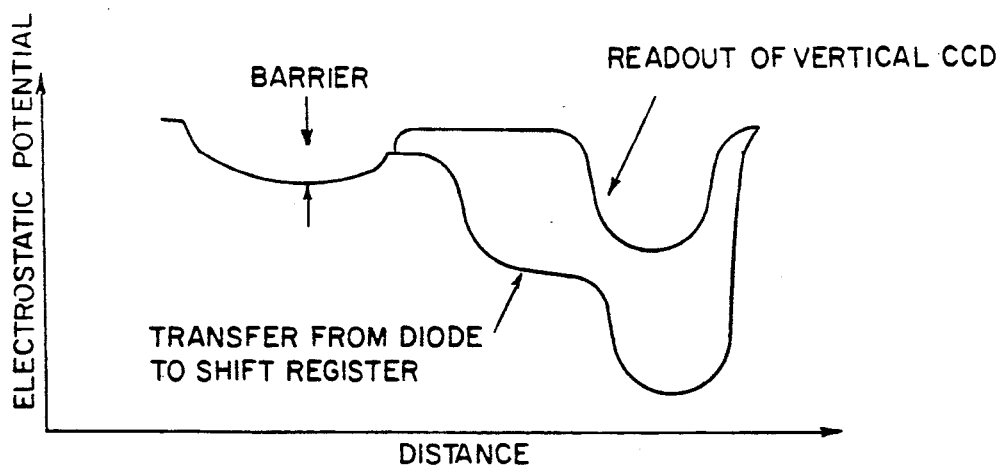
Figure 2C:
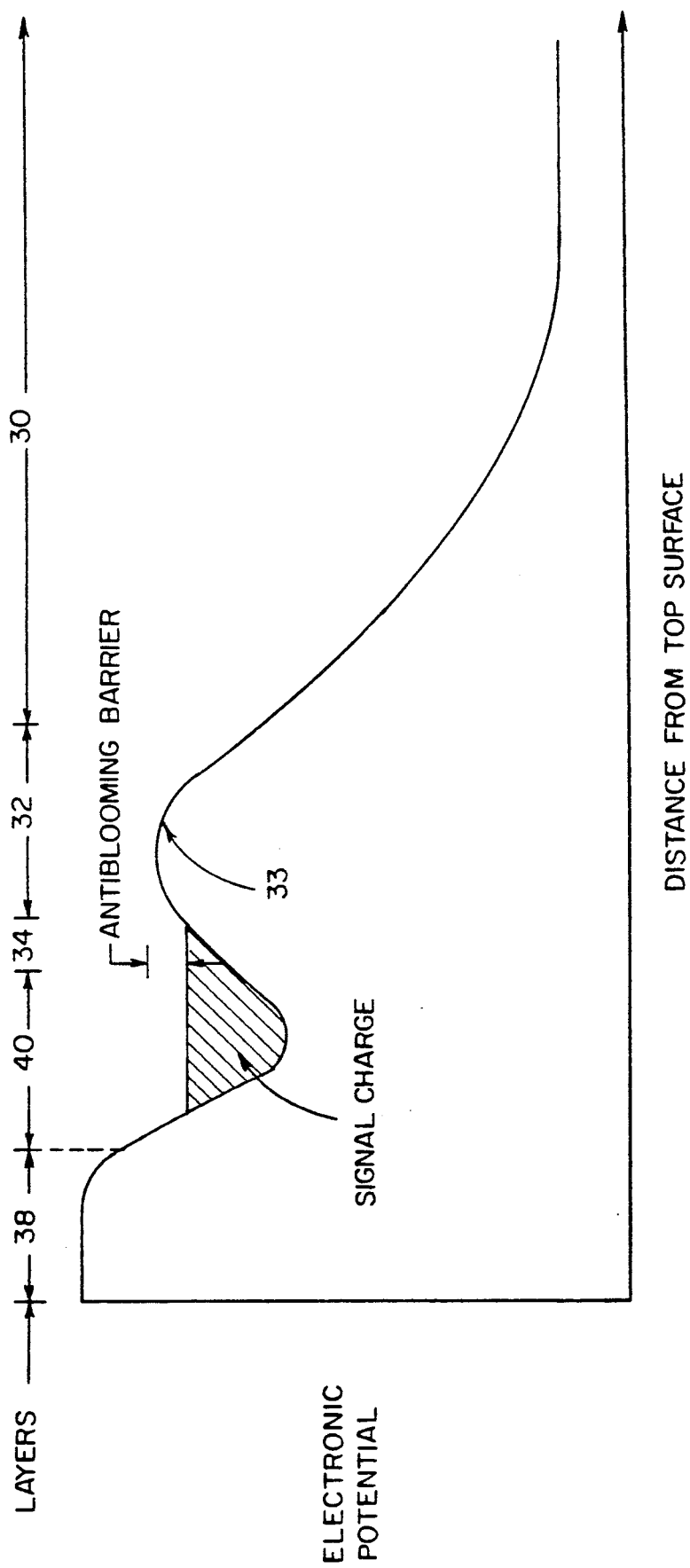
FIG. 2c illustrates an electrostatic potential diagram taken along the lines 3—3 of FIG. 4 from surface to substrate showing the antiblooming barrier and VOD depth.

With reference to FIG. 2c, the photodiode overflow point of the vertical antiblooming overflow drain is always confined to near the midpoint of the p-well 32 between the n-well 34 and the n-substrate 30. This provides for high quantum efficiency. FIG. 2c illustrates, schematically, the electrostatic potential along section 3 in FIG. 4. As discussed above, the n-regions of the photodiode are formed from uniform n-layer 34 and localized n-layer 40. The corresponding p-layers that form the photodiode p-n junctions are uniform p-layer 32 and localized p-layer 38, respectively. Signal charge is collected in the photodiode as is indicated in FIG. 2c. At some level of filling of the photodiode, the potential barrier between the photodiode and the substrate is reduced to a small value and any additional signal charge will flow to the substrate and be lost. This is the vertical overflow drain antiblooming function. The maximum point of the potential barrier, 33, is located near the midpoint of the uniform p-layer 32 and is simply determined by the electrostatics of the structure. Quantum efficiency is the ratio of signal charge to incident photons and is determined by the volume available for absorption of light. The depth in the substrate for this volume, due to the maximum potential barrier point 33, in p-layer 32 is illustrated in FIG. 2c. All potential signal charge generated deeper into the substrate than point 33 will be swept to the n-substrate, 30, rather than the photodiode, and lost. Therefore, in this preferred embodiment, the p-layer, 32, is placed deeply below the surface, thus resulting in high quantum efficiency. All photons absorbed from the surface to this depth are collected and result in signal. Green and red light have a penetration depth deeper than this so increasing the depth of the overflow point results in an increase of the quantum efficiency in the green and red part of the spectrum. Blue light is strongly absorbed so is less affected.

Turning now to FIG. 5, a p-stripe 36, one for each photodiode, is formed in the n-well 34 under the polysilicon gate electrode 22. It extends upward to the gate oxide but is spaced from its corresponding photodiode. The p-stripe becomes the "effective substrate" for construction of the CCD shift registers. The buried channel CCD (n-region 20) is constructed in the p-stripe 36, and the CCD is clocked against the p-stripe 36 so an electrical contact must be made to the p-stripe, i.e., the device must have a p-well contact. Therefore, in this connection, it should be noted that the p-stripe 36 contacts layers 38 and 17a which are grounded.

Figure 1:
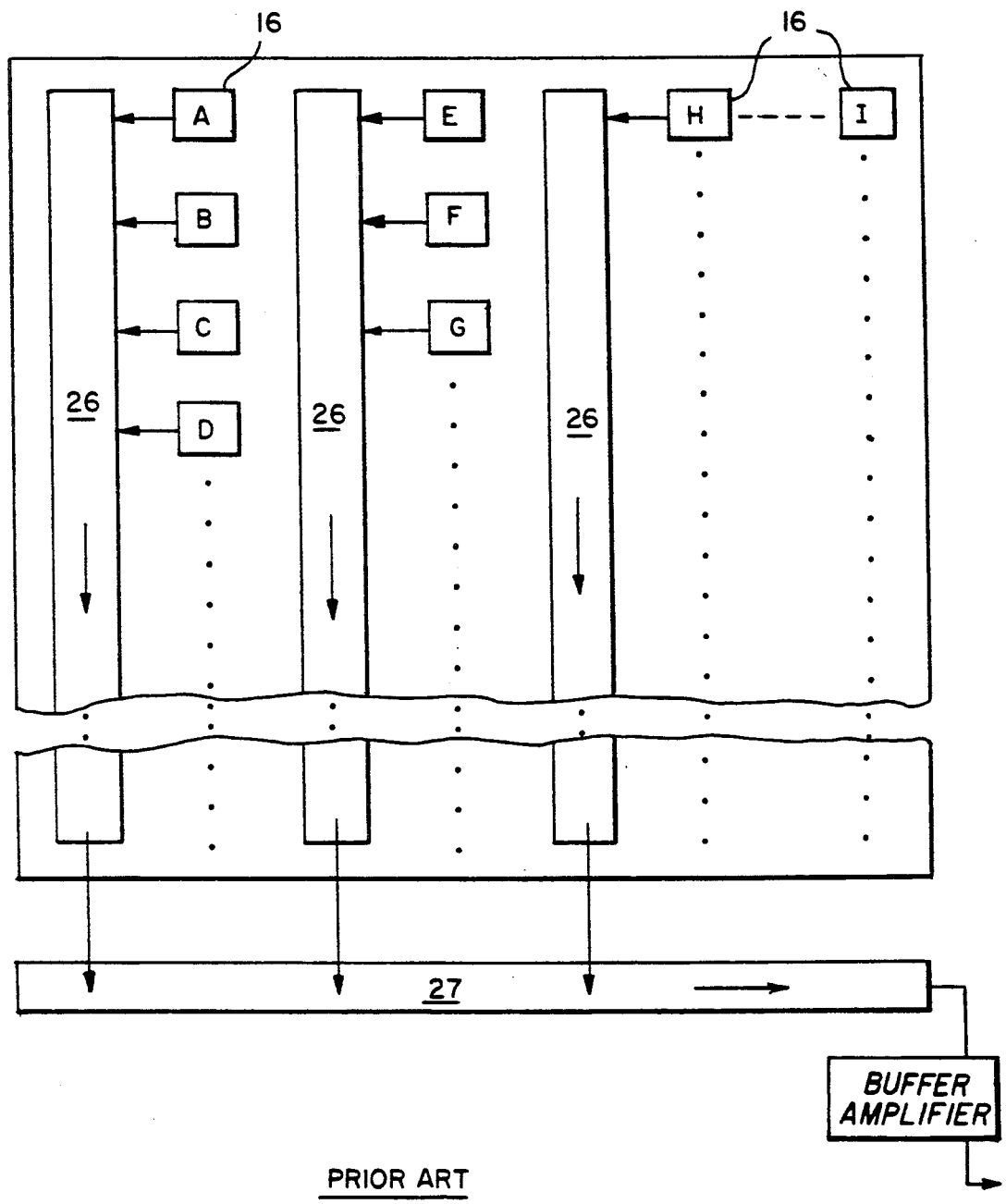
FIG. 1 is a schematic plan view of a conventional interline CCD area image sensor.
Figure 6:
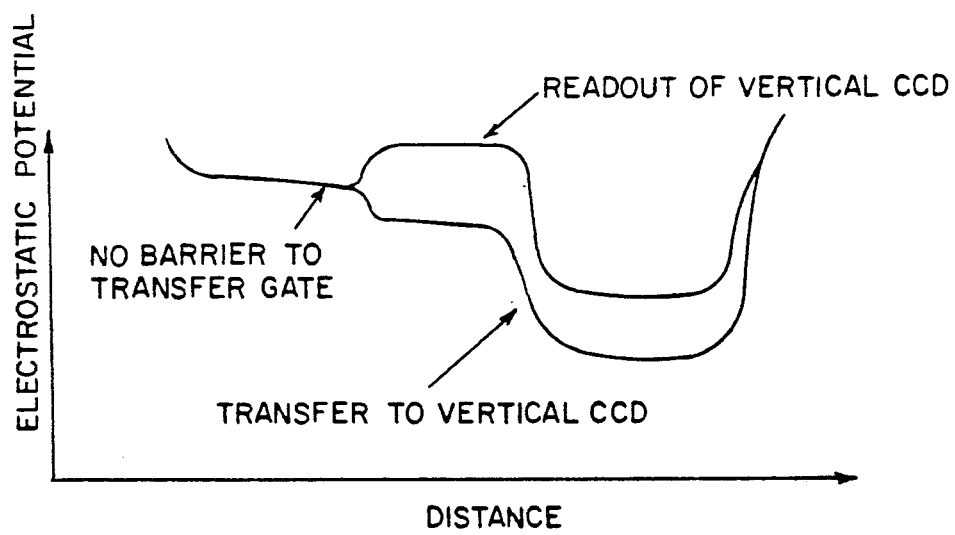
FIG. 6 shows the electrostatic potential curves for operating the pixel of FIG. 5.

A controlled amount of lateral diffusion of the p-stripe under the transfer gate is essential to control the threshold voltage of the transfer gate 24 (see FIG. 1). Without this p-doping the region beneath the transfer gate would be n-type from the uniform n-well and the transfer gate would be a depletion mode transistor with a negative threshold voltage, thus constraining the phase drive voltages to excessively negative values. As shown in FIG. 6, when a voltage signal is applied to the transer gate, there is no electrostatic potential barrier to charge transfer and the photodiode is therefore completely depletable.

The n-substrate 30 may be n-epi on n-substrate or just an n-type substrate. The processing steps are as follows: (1) ion implant a uniform p-well 32 (boron) into the surface of the wafer. The dose is advantageously in the range of 3-7E11/cm$^2$. Diffuse this boron layer for an extended time/temperature combination to drive the junction in the order of 2-3 microns below the substrate surface. This light uniform p-well 32 implant requires only gross masking and can occur everywhere in the imager. (2) Ion implant the light uniform n-well 34. This implant may be phosphorus at a dose of the same magnitude as the light p-well, i.e., 3-7E11/cm$^2$. The exact magnitudes of the uniform n- and p-well implant dose and energy can be easily determined by 2-dimensional process and electrostatics modeling. This implant is then thermally diffused for an extended time so that the resultant junction with the uniform lightly doped p-well 32 is 1-1.5 $\mu$m below the substrate surface. Additional diffusion of the n-well 34 drives the p-well junction to 3.5-4 $\mu$m. The resultant doping distribution is a uniform n-layer at the surface of the substrate extending 1-1.5 $\mu$m below the surface and a uniform p-layer extending from 1-1.5 $\mu$m below the surface to 3.5-4 $\mu$m below the surface. The initial n-substrate lies below the p-layer. This light n-well 34 also requires only gross masking. It is placed under the image area and may or may not be included under the horizontal CCD shift register, but is probably not desirable under the output source follower amplifier. An important factor is the integrated uncompensated boron remaining between the substrate and the uniform n-layer and will lie in the range 0.5-1.-5E11/cm$^2$. The exact amount depends on the proximity of the isolation and the p-stripe to be discussed next. (3) Ion implant the p-well stripe 36 in the region where the vertical CCD shift register will be constructed. This is a masked boron implant, the opening for the implant being approximately the same as that for the buried channel along the transfer gate side of the buried channel, and either along the edge of the buried channel or within the isolation on the side opposite the transfer gate. Thermally diffuse the p-stripe 36 so that the junction with the light n-well is approximately 1.25 $\mu$m below the top surface.

This diffusion step will drive the other junctions only slightly deeper. This diffusion step will drive the p-stripe 36 laterally under the transfer gate 24 (FIG. 1) toward the photodiode. It is this p-type dopant that controls the threshold voltage or channel potential under the transfer gate, so the diffusion step must be adequate to place a sufficiently high concentration beneath the transfer gate. However, the p-stripe must not diffuse beyond the transfer gate into the diode 16 because it will then result in an electrostatic potential barrier to the transfer gate, as discussed above. Modeling and experimental results indicate that a 1.2 $\mu$m transfer gate is sufficient to both have no barrier and also maintain proper gate control. At this point the remaining fabrication steps are the same as would occur for any interline CCD imager sensor constructed in a p-well. As is apparent from cross-section FIG. 4, the diodes are depletion isolated in the vertical direction. Although the n-type diodes appear to be shorted together beneath the p-field isolation, the doping of the uniform, n-layer, 34, is sufficiently low that this region is completely depleted during operation and a large potential barrier isolates the photodiodes in this direction. This same depletion isolation prevails at any boundary between a photodiode and an adjacent vertical shift register.

The invention has been described in detail with particular reference to a certain preferred embodiment thereof, but it will be understood that variations and modifications can be effected within the spirit and scope of the invention.

I claim:

1. In an interline area image sensor which eliminates image lag while providing antiblooming protection and has a substrate having two and bottom surface in which is fabricated an array of photodiodes, a plurality of vertical CCDs for transferring charge in said image sensor including a plurality of transfer gate electrodes, each transfer gate electrode being formed over the substrate top surface and corresponding to a particular photodiodes and extending over a substrate transfer region positioned adjacent to a corresponding photodiode and responsive to a voltage signal for transferring charge from its corresponding photodiode to its particulate CCD, the improvement comprising:

a) the substrate having an n-conductive portion, a laterally uniformly lightly doped p-well formed in the n-conductive portion and spaced from the top surface of the substrate, a laterally uniformly lightly doped n-well formed in the substrate on top of the uniform p-well, a plurality of localized n-layers formed in the n-well in an array corresponding to the array of the photodiodes and a separate localized p-layer formed in each n-layer to complete a photodiode for collecting photocharge, and such p-layers being connected to a predetermined potential, so as to provide a vertical antiblooming overflow drain having a maximum point of potential barrier which is confined to be in the uniform p-well to maintain high quantum efficiency; and b) a plurality of p-stripes formed in the uniform lightly doped n-well adjacent the photodiodes and having a portion formed under each CCD and a thermally diffused portion providing sufficient doping beneath a transfer gate electrode but not extending to an adjacent photodiode such that when the voltage signal is applied to the transfer gate electrode, signal charge collected in the photodiode is transferred to it's CCD leaving the photodiode completely depleted, said p-stripes being connected to the predetermined potential.

* * * * *